US010643680B2

(12) United States Patent
Pinarbasi et al.

(10) Patent No.: US 10,643,680 B2
(45) Date of Patent: *May 5, 2020

(54) MEMORY CELL HAVING MAGNETIC TUNNEL JUNCTION AND THERMAL STABILITY ENHANCEMENT LAYER

(71) Applicant: Spin Memory, Inc., Fremont, CA (US)

(72) Inventors: Mustafa Pinarbasi, Morgan Hill, CA (US); Bartek Kardasz, Pleasanton, CA (US)

(73) Assignee: Spin Memory, Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/123,663

(22) Filed: Sep. 6, 2018

(65) Prior Publication Data

US 2019/0006582 A1 Jan. 3, 2019

Related U.S. Application Data

(63) Continuation of application No. 15/656,398, filed on Jul. 21, 2017, now Pat. No. 10,381,555, which is a (Continued)

(51) Int. Cl.
*G11C 11/16* (2006.01)
*H01L 43/08* (2006.01)
(Continued)

(52) U.S. Cl.
CPC ........... *G11C 11/161* (2013.01); *G11C 11/15* (2013.01); *H01F 10/3286* (2013.01);
(Continued)

(58) Field of Classification Search
CPC ....... G11C 11/161; G11C 11/15; G11C 11/16; H01L 43/08; H01L 43/02; H01L 43/10;
(Continued)

(56) References Cited

U.S. PATENT DOCUMENTS 341,801 A 5/1886 Fox
5,541,868 A 7/1996 Prinz
(Continued)

FOREIGN PATENT DOCUMENTS

CA 2766141 A1 1/2011
CN 101036195 A 9/2008
(Continued)

OTHER PUBLICATIONS

NonFinal Office Action dated Jan. 15, 2019 in U.S. Appl. No. 15/862,788.
(Continued)

*Primary Examiner* — Bac H Au
(74) *Attorney, Agent, or Firm* — Arnold & Porter Kaye Scholer (57) ABSTRACT

A magnetoresistive random-access memory (MRAM) device is disclosed. The device described herein has a thermal stability enhancement layer over the free layer of a magnetic tunnel junction. The thermal stability enhancement layer improves the thermal stability of the free layer, increases the magnetic moment of the free layer, while also not causing the magnetic direction of the free layer to become in plan. The thermal stability enhancement layer can be comprised of a layer of CoFeB ferromagnetic material.

13 Claims, 5 Drawing Sheets

Related U.S. Application Data continuation of application No. 15/157,783, filed on May 16, 2016, now Pat. No. 9,741,926.

(60) Provisional application No. 62/287,994, filed on Jan. 28, 2016.

(51) Int. Cl.

| | | |
|---|---|---|
| *H01L 43/12* | (2006.01) | |
| *G11C 11/15* | (2006.01) | |
| *H01F 10/32* | (2006.01) | |
| *H01L 43/02* | (2006.01) | |
| *H01L 43/10* | (2006.01) | |
| *H01L 27/22* | (2006.01) | |

(52) U.S. Cl.
CPC .............. *H01L 43/02* (2013.01); *H01L 43/08* (2013.01); *H01L 43/10* (2013.01); *H01L 43/12* (2013.01); *H01L 27/222* (2013.01); *H01L 27/224* (2013.01)

(58) Field of Classification Search
CPC ..... H01L 27/222; H01L 43/12; H01L 27/224; H01F 10/3286
See application file for complete search history.

(56) References Cited

U.S. PATENT DOCUMENTS

| | | |
|---|---|---|
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,272,036 B1 | 8/2001 | You et al. |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,154 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |

(56) References Cited

U.S. PATENT DOCUMENTS

| | | |
|---|---|---|
| 9,129,690 B2 | 9/2015 | Park et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 5/2016 | Pinarbasi et al. |
| 9,362,486 B2 | 6/2016 | Kim et al. |
| 9,378,817 B2 | 6/2016 | Lee et al. |
| 9,379,314 B2 | 6/2016 | Park |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 9,777,974 B2 | 10/2017 | Kamitani et al. |
| 9,818,464 B2 | 11/2017 | Saida et al. |
| 9,853,206 B2 | 12/2017 | Pinarbasi et al. |
| 10,008,248 B2 | 6/2018 | Buhrman et al. |
| 10,026,892 B2 | 7/2018 | Pinarbasi et al. |
| 10,032,978 B1 | 7/2018 | Schabes et al. |
| 10,229,724 B1 | 3/2019 | el Baraji et al. |
| 10,236,047 B1 | 3/2019 | Ryan et al. |
| 10,236,048 B1 | 3/2019 | Tzoufras et al. |
| 10,236,439 B1 | 3/2019 | Schabes et al. |
| 10,270,027 B1 | 4/2019 | Gajek et al. |
| 10,360,961 B1 | 7/2019 | Tzoufras et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0002184 A1 | 1/2006 | Hong et al. |
| 2006/0018057 A1 | 1/2006 | Huai |
| 2006/0044703 A1 | 3/2006 | Inomata et al. |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0164547 A1* | 7/2008 | Higo .................. B82Y 10/00 257/421 |
| 2008/0185670 A1 | 8/2008 | Kajiyama |
| 2008/0259508 A2 | 10/2008 | Kent et al. |
| 2008/0273274 A1 | 11/2008 | Kojima et al. |
| 2008/0297292 A1 | 12/2008 | Viala et al. |
| 2009/0015958 A1 | 1/2009 | Nakamura et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2009/0244792 A1 | 10/2009 | Nakayama et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1 | 9/2011 | Igarashi |
| 2011/0235217 A1 | 9/2011 | Chen et al. |
| 2011/0305077 A1 | 12/2011 | Higo et al. |
| 2012/0012952 A1* | 1/2012 | Chen .................. H01L 43/08 257/421 |
| 2012/0052258 A1 | 3/2012 | Op Debeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0181305 A1 | 7/2013 | Nakayama et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0103473 A1 | 4/2014 | Kent et al. |
| 2014/0131824 A1 | 5/2014 | Kitagawa et al. |
| 2014/0159175 A1 | 6/2014 | Lee et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |

(56) References Cited

U.S. PATENT DOCUMENTS

| | | |
|---|---|---|
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171315 A1 | 6/2015 | Gan et al. |
| 2015/0171316 A1 | 6/2015 | Park et al. |
| 2015/0279904 A1 | 10/2015 | Pinarbasi |
| 2015/0287910 A1 | 10/2015 | Lu |
| 2015/0357015 A1 | 12/2015 | Kent et al. |
| 2015/0372687 A1 | 12/2015 | Buhrman et al. |
| 2016/0027999 A1 | 1/2016 | Pinarbasi et al. |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0018705 A1 | 1/2017 | Harms et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0236570 A1 | 8/2017 | Kent et al. |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |
| 2018/0205001 A1 | 7/2018 | Beach et al. |
| 2018/0248110 A1 | 8/2018 | Kardasz et al. |
| 2018/0248113 A1 | 8/2018 | Pinarbasi et al. |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-4012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-098365 | 4/2008 |
| JP | 2008-524830 A | 7/2008 |
| JP | 2008-192832 | 8/2008 |
| JP | 2009-027177 A | 2/2009 |
| JP | 2012-004222 | 1/2012 |
| JP | 2013-012546 A | 1/2013 |
| JP | 2013-048210 | 3/2013 |
| JP | 2013-219010 A | 10/2013 |
| JP | 2014-022751 | 2/2014 |
| JP | 2014 039061 A | 2/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 | 9/2014 |
| KR | 10-2015-0016162 | 2/2015 |
| WO | WO 2009/080636 A1 | 7/2009 |
| WO | WO 2011/005484 A2 | 1/2011 |
| WO | WO 2013/027406 | 2/2013 |
| WO | WO 2014/062681 A1 | 4/2014 |
| WO | WO 2015/153142 A1 | 10/2015 |
| WO | WO 2016/011435 A1 | 1/2016 |
| WO | WO 2016/014326 A1 | 1/2016 |
| WO | WO 2016/048603 A1 | 3/2016 |
| WO | WO 2016/171800 A1 | 10/2016 |
| WO | WO 2016/171920 A1 | 10/2016 |
| WO | WO 2016/204835 A1 | 12/2016 |
| WO | WO 2017/019134 A1 | 2/2017 |
| WO | WO 2017/030647 A1 | 2/2017 |
| WO | WO 2017/131894 A1 | 8/2017 |
| WO | WO 2017/151735 A1 | 9/2017 |

OTHER PUBLICATIONS

Final Office Action dated Jul. 9, 2015 in U.S. Appl. No. 14/242,419; 19 pages.
Final Office Action dated Jun. 9, 2017 in U.S. Appl. No. 14/814,038; 19 pages.
Final Office Action dated Aug. 2, 2018 in U.S. Appl. No. 15/674,620.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Jan. 20, 2016 in U.S. Appl. No. 14/242,419; 17 pages.
NonFinal Office Action dated Dec. 9, 2017 in U.S. Appl. No. 14/866,359; 26 pages.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
Notice of Allowance dated Sep. 26, 2018 in U.S. Appl. No. 15/859,047; 10 pages.
Notice of Allowance dated Oct. 24, 2018 in U.S. Appl. No. 15/859,517.
Office Action dated Aug. 30, 2018 in Chinese Patent Application No. 201580009984.2.
Office Action dated Oct. 9, 2018 in Japanese Patent Application No. 2016-526761.
Berger et al.; U.S. Appl. No. 15/174,482, filed Jun. 6, 2016, entitled "Method and Apparatus for Bipolar Memory Write-Verify".
Bozdag et al.; U.S. Appl. No. 15/859,047, filed Dec. 29, 2017, entitled "Three-Terminal MRAM with AC Write-Assist for Low Read Disturb".
El Baraji et al.; U.S. Appl. No. 15/859,514, filed Dec. 30, 2017, entitled "Microwave Write-Assist in Orthogonal STT-MRAM".
El Baraji et al.; U.S. Appl. No. 15/859,517, filed Dec. 30, 2017, entitled "Microwave Write-Assist in Series-Interconnected Orthogonal STT-MRAM Devices".

(56) References Cited

OTHER PUBLICATIONS

Gajek et al.; U.S. Appl. No. 15/858,988, filed Dec. 29, 2017, entitled "Self-Generating AC Current Assist in Orthogonal STT-MRAM".
Ikeda et al.; "A perpendicular-anisotropy CoFeB-MgO magnetic tunnel junction"; *Nature Materials*, vol. 9, Sep. 2010; pp. 721-724 (4 pages).
International Search Report and Written Opinion dated Jul. 10, 2015 in PCT/US2015/021580; 12 pages.
International Search Report and Written Opinion dated Oct. 30, 2015 in PCT/US2015/040700; 11 pages.
International Search Report and Written Opinion dated Dec. 14, 2015 in PCT/US2015/047875; 13 pages.
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
International Search Report and Written Opinion dated Apr. 7, 2017 in PCT/US2016/067444; 13 pages.
International Search Report and Written Opinion dated May 10, 2018 in PCT/US2018/014645; 14 pages.
International Search Report and Written Opinion dated May 30, 2018 in PCT/US2018/014641; 13 pages.
Kardasz et al.; U.S. Appl. No. 14/866,359, filed Sep. 25, 2015 entitled "Spin Transfer Torque Structure for MRAM Devices Having a Spin Current Injection Capping Layer".
Kardasz et al.; U.S. Appl. No. 15/091,853, filed Apr. 6, 2016, entitled "High Annealing Temperature Perpendicular Magnetic Anisotropy Structure for Magnetic Random Access Memory".
Kardasz et al.; U.S. Appl. No. 15/657,498, filed Jul. 24, 2017, entitled "Spin Transfer Torque Structure for MRAM Devices Having a Spin Current Injection Capping Layer".
Kent et al.; U.S. Appl. No. 61/715,111, filed Oct. 17, 2012, entitled "Inverted Orthogonal Spin Transfer Layer Stack".
Koch et al., "Thermally Assisted Magnetization Reversal in Submicron-Sized Magnetic Thin Films"; *Physical Review Letters; The American Physical Society*; vol. 84, No. 23; Jun. 5, 2000, pp. 5419-5422 (4 pages).
Lee et al., "Analytical investigation of spin-transfer dynamics using a perpendicular-to-plane polarizer"; *Applied Physics Letters; American Institute of Physics*; vol. 86, (2005); pp. 022505-1 to 022505-3 (3 pages).
"Magnetic Technology Sprintronics, Media and Interface"; *Data Storage Institute, R&D Highlights*; Sep. 2010; 3 pages.
Martens et al., "Thermally Induced Magnetic Switching in Thin Ferromagnetic Annuli"; NSF grants PHY-0351964 (DLS); 2005; 11 pages.
Martens et al., "Magnetic Reversal in Nanoscopic Ferromagnetic Rings"; NSF grants PHY-0351964 (DLS); 2006; 23 pages.
Notice of Allowance dated Jul. 27, 2017 in U.S. Appl. No. 15/097,576; 22 pages.
Notice of Allowance dated Oct. 16, 2017 in U.S. Appl. No. 14/814,036; 16 pages.
Pinarbasi et al.; U.S. Appl. No. 14/341,185, filed Jul. 25, 2014, entitled "Method for Manufacturing MTJ Memory Device".
Pinarbasi et al.; U.S. Appl. No. 14/492,943, filed Sep. 22, 2014, entitled "Magnetic Tunnel Junction Structure for MRAM Device".
Pinarbasi et al.; U.S. Appl. No. 14/814,036, filed Jul. 30, 2015, entitled "Precessional Spin Current Structure for MRAM".
Pinarbasi et al.; U.S. Appl. No. 15/041,325, filed Feb. 11, 2016, entitled "Method for Manufacturing MTJ Memory Device".
Pinarbasi et al.; U.S. Appl. No. 15/093,367, filed Apr. 7, 2016, entitled "Magnetic Tunnel Junction Structure for MRAM Device".
Pinarbasi et al.; U.S. Appl. No. 15/097,576, filed Apr. 13, 2016, entitled "Polishing Stop Layer(s) for Processing Arrays of Semiconductor Elements".
Pinarbasi et al.; U.S. Appl. No. 15/157,783, filed May 18, 2016, entitled "Memory Cell Having Magnetic Tunnel Junction and Thermal Stability Enhancement Layer".
Pinarbasi et al.; U.S. Appl. No. 15/445,260, filed Feb. 28, 2017, entitled "Precessional Spin Current Structure for MRAM".
Pinarbasi et al.; U.S. Appl. No. 15/445,362, filed Feb. 28, 2017, entitled "Precessional Spin Current Structure for MRAM".
Pinarbasi et al.; U.S. Appl. No. 15/656,398, filed Jul. 21, 2017, entitled "Memory Cell Having Magnetic Tunnel Junction and Thermal Stability Enhancement Layer".
Pinarbasi et al.; U.S. Appl. No. 15/674,620, filed Aug. 11, 2017, entitled "Polishing Stop Layer(s) for Processing Arrays of Semiconductor Elements".
Ryan et al.; U.S. Appl. No. 15/859,015, filed Dec. 29, 2017, entitled "Shared Oscillator (STNO) for MRAM Array Write-Assist in Orthogonal STT-MRAM".
Pinarbasi et al.; U.S. Appl. No. 15/794,871, filed Oct. 26, 2017, entitled "Precessional Spin Current Structure for MRAM ".
Seo et al.; "Current-induced synchronized switching of magnetization;" *Applied Physics Letters* 101; 2012 American Institute of Physics; Aug. 7, 2012; 6 pages.
Notice of Allowance dated Apr. 21, 2017 in U.S. Appl. No. 15/157,783; 36 pages.
Schabes et al.; U.S. Appl. No. 15/634,629, filed Jun. 27, 2017, entitled "MRAM with Reduced Stray Magnetic Fields".
Schabes et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Schabes et al.; U.S. Appl. No. 15/859,384, filed Dec. 30, 2017, entitled "Perpendicular Magnetic Tunnel Junction Device with Skyrmionic Assist Layers for Free Layer Switching".
Schabes et al.; U.S. Appl. No. 15/859,381, filed Dec. 30, 2017, entitled Perpendicular Magnetic Tunnel Junction Device with Precessional Spin Current Layer Having a Modulated Moment Density.
Schabes et al.; U.S. Appl. No. 15/859,379, filed Dec. 30, 2017, entitled "Perpendicular Magnetic Tunnel Junction Device with Offset Precessional Spin Current Layer".
Schabes et al.; U.S. Appl. No. 15/859,374, filed Dec. 30, 2017, entitled "Switching and Stability Control for Perpendicular Magnetic Tunnel Junction Device".
Tzoufras et al.; U.S. Appl. No. 15/858,950, filed Dec. 29, 2017, entitled "AC Current Pre-Charge Write-Assist in Orthogonal STT-MRAM".
Tzoufras et al.; U.S. Appl. No. 15/859,030, filed Dec. 29, 2017, entitled "AC Current Write-Assist in Orthogonal STT-MRAM".
Final Office Action dated Nov. 8, 2018 in U.S. Appl. No. 15/445,260.
Final Office Action dated Nov. 16, 2018 in U.S. Appl. No. 15/445,362.
Final Office Action dated Dec. 13, 2018 in U.S. Appl. No. 15/091,853.
NonFinal Office Action dated Nov. 23, 2018 in U.S. Appl. No. 15/859,384.
NonFinal Office Action dated Nov. 26, 2018 in U.S. Appl. No. 15/858,950.
Notice of Allowance dated Nov. 9, 2018 in U.S. Appl. No. 15/859,015.
Notice of Allowance mailed Nov. 21, 2018 in U.S. Appl. No. 15/859,030.
Notice of Allowance dated Nov. 21, 2018 in U.S. Appl. No. 15/859,374.
Notice of Allowance dated Nov. 30, 2018 in U.S. Appl. No. 15/859,514.
Notice of Allowance dated Dec. 12, 2018 in U.S. Appl. No. 15/858,988.
Extended European Search Report dated Jan. 30, 2019 in EU Application No. 16812075.6.
NonFinal Office Action dated Mar. 22, 2019 in U.S. Appl. No. 16/027,739.
NonFinal Office Action dated Jun. 25, 2019 in U.S. Appl. No. 16/197,622.
NonFinal Office Action dated Aug. 15, 2019 in U.S. Appl. No. 15/674,620.

(56) References Cited

OTHER PUBLICATIONS

NonFinal Office Action dated Sep. 4, 2019 in U.S. Appl. No. 15/445,260.
NonFinal Office Action dated Sep. 16, 2019 in U.S. Appl. No. 15/445,362.
Notice of Allowance dated Feb. 12, 2019 in U.S. Appl. No. 15/859,381.
Notice of Allowance dated Mar. 21, 2019 in U.S. Appl. No. 15/858,950.
Notice of Allowance dated Jun. 26, 2019 in U.S. Appl. No. 15/091,853.
Office Action dated Jul. 23, 2019 in Japanese Patent Application No. 2016-529428 (with English translation).

\* cited by examiner

MEMORY CELL HAVING MAGNETIC TUNNEL JUNCTION AND THERMAL STABILITY ENHANCEMENT LAYER

CROSS-REFERENCE TO RELATED APPLICATION

This application is continuation of U.S. patent application Ser. No. 15/656,398, filed Jul. 21, 2017, which is a continuation of U.S. patent application Ser. No. 15/157,783, filed May 18, 2016, now U.S. Pat. No. 9,741,926, which claims the benefit of Provisional Application No. 62/287,994, filed Jan. 28, 2016. The present application also claims the benefit of U.S. Provisional Application No. 62/287,494. Priority to this provisional application is expressly claimed, and the disclosure of the provisional application is hereby incorporated herein by reference in its entirety.

FIELD

The present patent document relates generally to spin-transfer torque magnetic memory (STT-MRAM) devices and, more particularly, to STT-MRAM devices having thermal stability enhancement layer that increases the thermal stability of the free layer of a magnetic tunnel junction.

BACKGROUND

Magnetoresistive random-access memory ("MRAM") is a non-volatile memory technology that stores data through magnetic storage elements. In a type of MRAM, the magnetic storage elements comprise two ferromagnetic plates or electrodes that can hold a magnetic field and are separated by a non-magnetic material, such as a non-magnetic metal or insulator. Such a structure is called a magnetic tunnel junction ("MTJ"). In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer. Thus, the free layer is also referred to as the storage layer. MTJ's are manufactured using stacked materials, with each stack of materials forming an MTJ pillar.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized tunneling magnetoresistance (TMR) effect, the electrical resistance of the cell change due to the orientation of the magnetic fields of the two layers. The cell's resistance will be different for the parallel and anti-parallel states and thus the cell's resistance can be used to distinguish between a "1" and a "0". One important feature of MRAM devices is that they are non-volatile memory devices, since they maintain the information even when the power is off. The two plates can be sub-micron in lateral size and the magnetization direction can still be stable with respect to thermal fluctuations.

Spin transfer torque or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, i.e., it consists of 50% spin up and 50% spin down electrons. Passing a current though a magnetic layer polarizes electrons with the spin orientation corresponding to the magnetization direction of the magnetic layer (i.e., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer.

MRAM devices are considered as the next generation structures for wide range of memory applications. One MRAM technology uses a perpendicular magnetic tunnel junction device. In perpendicular MTJ devices, the free and reference layers are separated by a thin insulator layer for spin polarized tunneling. The free and reference layers have a magnetic direction that is perpendicular to their planes, thus creating a perpendicular magnetic tunnel junction (pMTJ). The pMTJ configuration may provide a lower critical switching current when compared to in-plane MTJ technology, simplified layer stack structure without need of using thick antiferromagnetic layers, and reduction of the device size below 40 nm.

Figure 1:
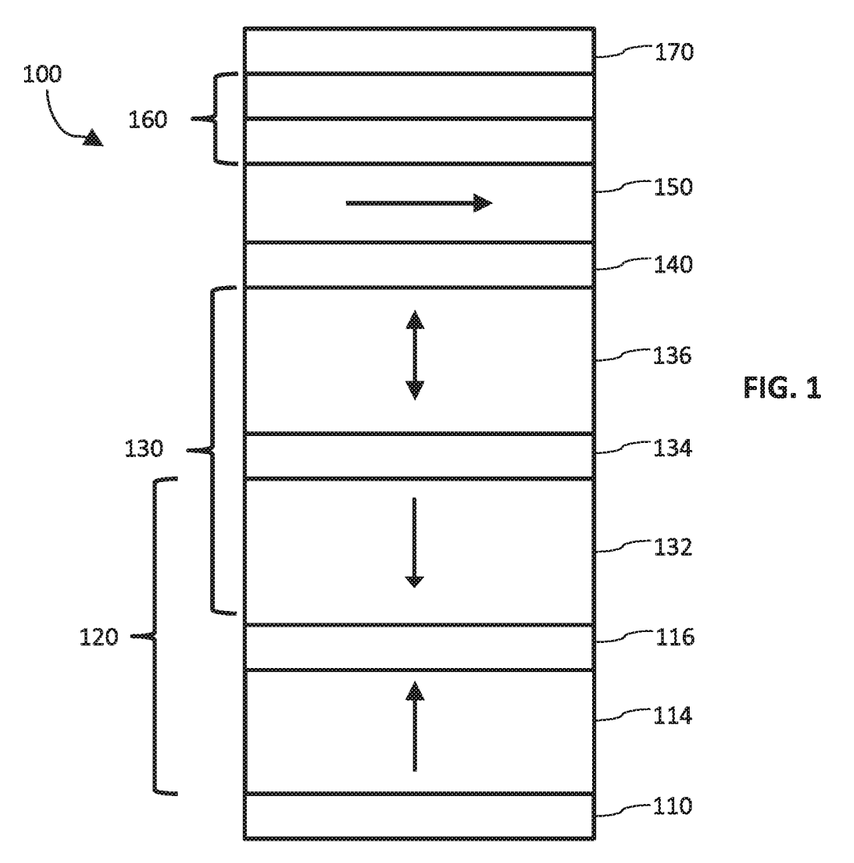
FIG. 1 illustrates a perpendicular MTJ stack for an MRAM device with orthogonal polarizing layer.

FIG. 1 illustrates a pMTJ stack 100 for a conventional MRAM device. As shown, stack 100 includes one or more seed layers 110 provided at the bottom of stack 100 to initiate a desired crystalline growth in the above-deposited layers. A perpendicular synthetic antiferromagnetic layer ("pSAF layer") 120 is disposed on top of the seed layers 110. MTJ 130 is deposited on top of synthetic antiferromagnetic (SAF) layer 120. MTJ 130 includes reference layer 132, which is a magnetic layer, a non-magnetic tunneling barrier layer (i.e., the insulator) 134, and the free layer 136, which is also a magnetic layer. It should be understood that reference layer 132 is actually part of SAF layer 120, but forms one of the ferromagnetic plates of MTJ 130 when the non-magnetic tunneling barrier layer 134 and free layer 136 are formed on reference layer 132. As shown in FIG. 1, magnetic reference layer 132 has a magnetization direction perpendicular to its plane. As also seen in FIG. 1, free layer 136 also has a magnetization direction perpendicular to its plane, but its direction can vary by 180 degrees.

The first magnetic layer 114 in the perpendicular SAF layer 120 is disposed over seed layer 110. Perpendicular SAF layer 120 also has an antiferromagnetic coupling layer 116 disposed over the first magnetic layer 114. As seen by the arrows in magnetic layers 114 and 132 of perpendicular SAF 120, layers 114 and 132 have a magnetic direction that is perpendicular to their respective planes. Furthermore, a nonmagnetic spacer 140 is disposed on top of MTJ 130 and a polarizer 150 may optionally be disposed on top of the nonmagnetic spacer 140. Polarizer 150 is a magnetic layer that has a magnetic direction in its plane, but is orthogonal to the magnetic direction of the reference layer 132 and free layer 136. Polarizer 150 is provided to polarize a current of electrons ("spin-aligned electrons") applied to pMTJ structure 100. Further, one or more capping layers 160 can be provided on top of polarizer 150 to protect the layers below on MTJ stack 100. Finally, a hard mask 170 is deposited over capping layers 160 and is provided to pattern the underlying layers of the MTJ structure 100, using a reactive ion etch (RIE) process.

As discussed, one type of MTJ is referred to as a perpendicular MTJ. In a perpendicular MTJ, the reference layer and the free layer each have a magnetic direction that is perpendicular to the plane of their respective layers. The resistance of the magnetic memory device is sensitive to the relative orientation of the magnetization vector of the free magnetic layer and the magnetization vector of the reference layer. The resistance of the magnetic memory device is highest when the magnetization vectors of the free magnetic layer and the reference layer, respectively, are in anti-parallel alignment. The resistance of the magnetic device is lowest when the magnetization vectors of the layers free magnetic layer and the reference layer, respectively, are in parallel alignment. Thus, a resistance measurement or its equivalent can determine the orientation of the magnetization vector of the free magnetic layer.

An important characteristic of MTJs is thermal stability. The thermal stability of each perpendicular MTJ, i.e., the magnetic bits, is proportional to the magnetic material volume of the MTJ for a given perpendicular anisotropy. Thermal stability of an MTJ is a factor in data retention capability. Thus, improving the thermal stability of the free layer of an MTJ is an important design consideration. Because of the relationship between the magnetic material volume of an MTJ and the perpendicular anisotropy, as MTJ pillar dimensions decreases, for example when shrinking an existing design for future generation MRAM devices, the thermal stability declines. This is highly undesirable. Unfortunately the thickness of the free layer cannot be increased at will to add more magnetic moment (volume) to enhance the thermal stability. Thus, the thermal stability of the free layer structure with a perpendicular magnetic direction cannot be enhanced simply by increasing the thickness of the material used to construct the free layer (typically CoFeB). This is because there is a limit on the thickness of CoFeB where the perpendicular anisotropy can be obtained. For CoFeB, this thickness may be around sixteen (16) Angstroms. Above this thickness, the magnetization reverses to be in plane, meaning that the MTJ will no longer be a perpendicular MTJ. Thus, the thermal stability of the perpendicular MTJ free (i.e., storage) layer cannot be enhanced by further increasing the free layer thickness.

Perpendicular magnetization direction can be achieved using surface perpendicular anisotropy (interface perpendicular magnetic anisotropy) which is an interface property of the ferromagnetic film and neighboring capping and seeding layer of non-magnetic material used for a free layer. Interface perpendicular magnetic anisotropy (IPMA) is inversely proportional to the thickness of the film. For common ferromagnetic materials, IPMA becomes strong enough to keep magnetization out of plane in the thickness range of 1.2 to 1.6 nm. However, at this thicknesses range, the magnetic moment of the free layer is small. This small magnetic moment of the free layer reduces thermal stability. On the other hand, increasing the free layer thickness lowers the IPMA, which causes the free layer to become in-plane magnetized. In a perpendicular MTJ device, this is not acceptable since it would cause degradation of the tunneling magnetoresistance (TMR) value to a level below which device can operate reliably. Thus, increasing the free layer thickness lowers the thermal stability by diminishing the perpendicular anisotropy. In addition, the device itself becomes useless, as the free layer loses its perpendicular magnetic anisotropy. This is one of the most difficult issues to address for perpendicular MTJ MRAM devices.

Thus, a need exists to enhance the thermal stability of the free layer of an MTJ where the thickness of the free layer does not have to be disturbed.

SUMMARY

An MRAM device is disclosed that comprises a thin layer of magnetic material having perpendicular anisotropy, referred to herein as a thermal stability enhancement (TSE) layer, deposited on a non-magnetic separation layer, where the non-magnetic separation layer is located between the free layer and the TSE layer. The TSE layer magnetization can be optimized as described herein to enhance the switching characteristics of the free layer.

In an embodiment, a magnetic device is disclosed. The embodiment comprises a bottom electrode in a first plane. The embodiment further comprises a perpendicular synthetic antiferromagnetic structure including a magnetic reference layer in a second plane, where the magnetic reference layer has a magnetization direction that is perpendicular to the second plane and having a fixed magnetization direction. The embodiment further discloses a non-magnetic tunnel barrier layer in a third plane, which is disposed over the magnetic reference layer. The embodiment further comprises a free magnetic layer in a fourth plane that is disposed over the non-magnetic tunnel barrier layer. The free magnetic layer has a magnetization vector that is perpendicular to the fourth plane and has a magnetization direction that can switch from a first magnetization direction to a second magnetization direction. The magnetic reference layer, the non-magnetic tunnel barrier layer and the free magnetic layer forming a magnetic tunnel junction. The embodiment further comprises a non-magnetic thermal stability enhancement coupling layer in a fifth plane that is disposed over the free magnetic layer. The embodiment also comprises a magnetic thermal stability enhancement layer in a sixth plane that is physically separated from the free magnetic layer and coupled to the free magnetic layer by the non-magnetic thermal stability enhancement coupling layer. The magnetic thermal stability enhancement layer has a magnetization direction that is perpendicular to the sixth plane and has a magnetization direction that can switch from the first magnetization direction to the second magnetization direction, wherein switching of the magnetic thermal stability enhancement layer from the first magnetization direction to the second magnetization direction tracks switching in the magnetic free layer. The embodiment also comprises a cap layer in a seventh plane that is disposed over the thermal stability enhancement layer.

In an aspect of the embodiment, the magnetic device further comprises a current source that directs electrical current through the cap layer in the seventh plane, the magnetic thermal stability enhancement layer in a sixth plane, the non-magnetic thermal stability enhancement coupling layer in the fifth plane, the free magnetic layer in the fourth plane, the non-magnetic tunnel barrier layer in the third plane, the magnetic reference layer in the second plane, and the bottom electrode in the first plane.

In another aspect of the embodiment, the magnetic thermal stability enhancement layer comprises a layer of CoFeB.

In another aspect of the embodiment, the magnetic thermal stability enhancement layer comprises a film of CoFeB having a thickness between 1.3 nanometers and 1.5 nanometers.

In another aspect of the embodiment, the free magnetic layer comprises CoFeB with a Ta interlayer.

In another aspect of the embodiment, the free magnetic layer has a sum thickness of 1.6 nanometers.

In another aspect of the embodiment, the perpendicular synthetic antiferromagnetic structure further comprises a first magnetic pSAF layer and a second magnetic pSAF layer, where the first magnetic pSAF layer is over the first electrode and is separated from the second magnetic pSAF layer by an exchange coupling layer.

In another aspect of the embodiment, a ferromagnetic coupling layer is in between the second magnetic pSAF layer and the magnetic reference layer.

In another aspect of the embodiment, the magnetic thermal stability enhancement layer is magnetically coupled to the free magnetic layer by the non-magnetic thermal stability enhancement coupling layer.

In another aspect of the embodiment, the non-magnetic thermal stability enhancement coupling layer comprises a layer MgO.

In another aspect of the embodiment, the layer of MgO has a thickness between 0.6-1.2 nm.

In another aspect of the embodiment, the layer of MgO has a thickness 0.7 nm.

In another aspect of the embodiment, the non-magnetic thermal stability enhancement coupling layer provides high interface perpendicular magnetic anisotropy between the magnetic thermal stability enhancement layer and free magnetic layer such that the magnetic direction of the free magnetic layer remains perpendicular to the fourth plane and the magnetic direction of the magnetic thermal stability enhancement layer remains perpendicular to the sixth plane.

In another embodiment, a magnetic device is disclosed that comprises a perpendicular magnetic tunnel junction having a magnetic reference layer and a magnetic free layer. The magnetic reference layer and the magnetic free layer are separated by a non-magnetic tunneling barrier layer. The magnetic reference layer has a fixed magnetic direction that is perpendicular to its plane. The magnetic free layer has a variable magnetic direction that can switch between a first perpendicular magnetic direction and second perpendicular magnetic direction. The first perpendicular magnetic direction and the second perpendicular magnetic direction is perpendicular to the magnetic free layer. The embodiment further comprises a magnetic thermal stability enhancement layer disposed over the magnetic free layer of the magnetic tunnel junction. The magnetic thermal stability enhancement layer comprises a magnetic material having a variable magnetic direction that can switch between the first perpendicular magnetic direction and the second perpendicular magnetic direction. In an embodiment, the switching of the magnetic thermal stability enhancement layer from the first magnetization direction to the second magnetization direction tracks switching in the magnetic free layer. The embodiment further comprises a non-magnetic thermal stability enhancement coupling layer disposed in between and physically separating the magnetic free layer of the magnetic tunnel junction and the magnetic thermal stability enhancement layer. The non-magnetic thermal stability enhancement coupling layer magnetically couples the free magnetic layer and the magnetic thermal stability coupling layer.

In aspect of the embodiment, the magnetic device further comprises an electrode and a perpendicular synthetic antiferromagnetic structure coupled to the electrode. The perpendicular synthetic antiferromagnetic structure includes the magnetic reference layer. In an aspect of this embodiment, a cap layer is disposed over the magnetic thermal stability enhancement layer.

In another aspect of the embodiment, the perpendicular synthetic antiferromagnetic structure further comprises a first magnetic pSAF layer and a second magnetic pSAF layer. The first magnetic pSAF layer is over the electrode and is separated from the second magnetic pSAF layer by a non-magnetic exchange coupling layer.

In another aspect of the embodiment, the magnetic thermal stability enhancement layer comprises CoFeB.

In another aspect of the embodiment, the magnetic thermal stability enhancement layer comprises a film of CoFeB having a thickness between 1.3 nanometers and 1.5 nanometers.

In another aspect of the embodiment, the free magnetic layer comprises CoFeB with a Ta interlayer.

In another aspect of the embodiment, the free magnetic layer has a sum thickness of 1.6 nanometers.

In another aspect of the embodiment, the magnetic device further comprises a current source that directs electrical current through the cap layer, the magnetic thermal stability enhancement layer, the non-magnetic thermal stability enhancement coupling layer, the free magnetic layer, the non-magnetic tunnel barrier layer, the perpendicular synthetic antiferromagnetic structure, and the electrode.

In another aspect of the embodiment, the non-magnetic thermal stability enhancement coupling layer provides high interface perpendicular magnetic anisotropy between the magnetic thermal stability enhancement layer and free magnetic layer such that the magnetic direction of the free magnetic layer and the magnetic direction of the magnetic thermal stability enhancement layer remain out-of-plane.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use an STT-MRAM device using a perpendicular magnetic tunnel junction having a free layer with high thermal stability. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

Figure 2:
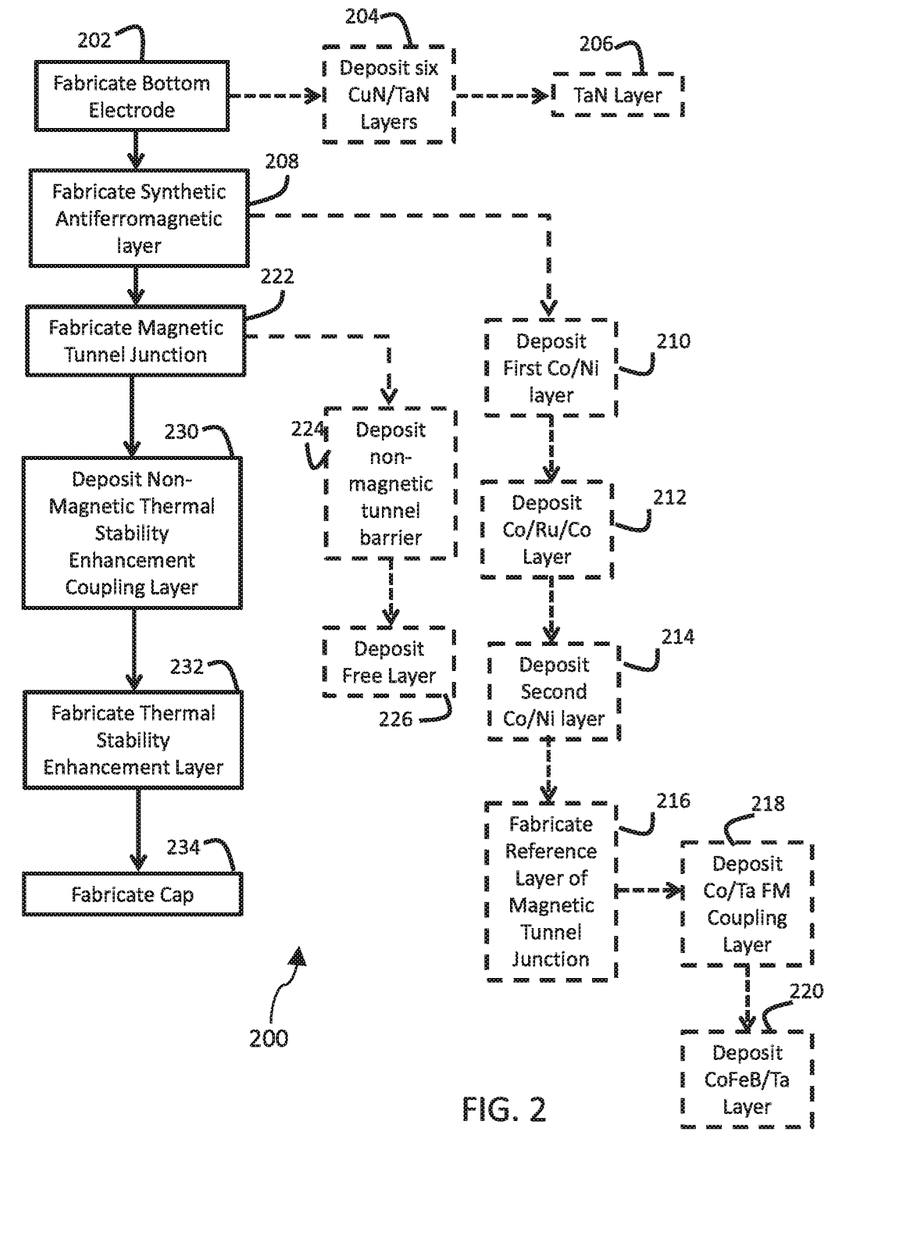
FIG. 2 illustrates a process for manufacturing a magnetic device using the concepts described herein.
Figure 3:
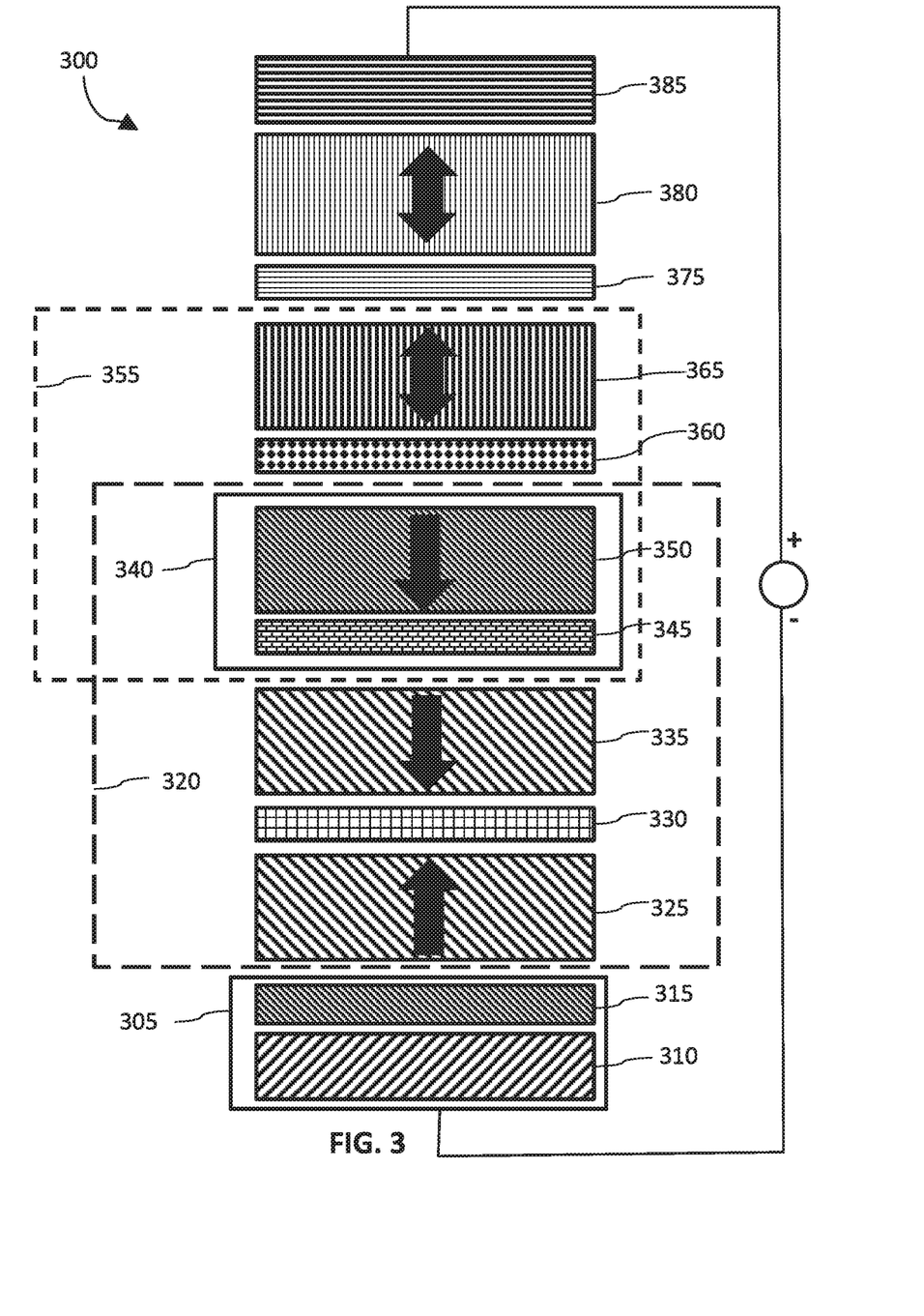
FIG. 3 illustrates the various layers of a magnetic device manufactured in accordance with the teachings described herein.

An embodiment of an STT-MRAM device using the present teachings will described with reference to FIGS. 2 and 3. FIG. 2 is a flow chart showing a method 200 for manufacture of an STT-MRAM device 300 using the present teachings. FIG. 3 illustrates the various layers of a STT-MRAM device 300 manufactured in accordance with the teachings described herein. It is noted that FIG. 3 is illustrated with space between each of the layers. A person having skill in the art will recognize that the gaps are for illustration purposes only, and that an actual STT-MRAM device will not have gaps between its various layers. Note that the various layers illustrated in FIG. 3 are for an exemplary device. A person having ordinary skill in the art would know that additional layers might be present or that specific layers that are illustrated might not be present in a device.

As will be discussed, STT-MRAM device 300 has a thin layer of magnetic material with perpendicular anisotropy, referred to herein as a thermal stability enhancement layer (TSE) 380. As described herein, the TSE layer is magnetically coupled to the free layer 365 of an MTJ 355 through a separation layer 375. A ferromagnetic coupling layer 345 on the opposite side of fixed magnetic reference layer 340 of MTJ 355 provides additional interfaces to achieve high IPMA, which allows the free layer to maintain an out of plane magnetization, which achieves a perpendicular TMR value above one hundred (100) percent.

To manufacture STT-MRAM device 300, in step 202, a bottom electrode 305 is fabricated on a semiconductor wafer (not shown) or other appropriate substrate structure. In an embodiment, bottom electrode 305 can comprise six TaN/CuN multilayers 310, each of which can have a thickness of six nanometers. These TaN/CuN multilayers 310 are deposited during step 204 using magnetron sputtering. Bottom electrode 305 can also comprise TaN layer 315 fabricated over the TaN/CuN multilayers 310, which in an embodiment can have a thickness of two nm. TaN layer 315 is deposited during step 206 by magnetron sputtering.

After fabricating bottom electrode 305, perpendicular synthetic antiferromagnet (pSAF) structure 320 is fabricated during step 208. As seen in FIG. 2, fabrication of pSAF 320 can include several steps, which will now be discussed. At step 210, a first magnetic pSAF layer 325 is fabricated. In an embodiment, first magnetic pSAF layer comprises a Co/Ni multilayer having perpendicular anisotropy. First magnetic pSAF layer 325 is deposited over TaN layer 315 of bottom electrode 305. First magnetic pSAF layer 325 is a magnetic layer having a magnetic direction perpendicular to its plane, as shown in FIG. 3. In an embodiment, first magnetic pSAF layer 325 comprises six Co/Ni layers, with each Co/Ni layer having a thickness of 0.8 nanometers.

Fabrication of pSAF 320 further includes step 212, where a non-magnetic exchange coupling layer 330 is deposited over first magnetic pSAF layer 325. In an embodiment, non-magnetic exchange coupling layer 330 is comprised of a Co/Ru/Co multilayer comprising a first and second 0.18 nm layer of Co separated by a 0.85 nm layer of Ru. Next, at step 214, a second magnetic pSAF layer 335 is deposited over exchange coupling layer 330. In an embodiment, second magnetic pSAF layer comprises a Co/Ni multilayer having perpendicular anisotropy. Second magnetic pSAF layer 335 is a magnetic layer having a magnetic direction perpendicular to its plane, as seen in FIG. 3. Second magnetic pSAF layer 335 can comprise four Co/Ni multilayers, with each Co/Ni multilayer having a thickness of 0.8 nanometers. As shown in FIG. 3, the magnetic directions of first magnetic pSAF layer 325 and second magnetic pSAF layer 335 are in an antiparallel arrangement with respect to each other due to antiferromagnetic coupling through exchange coupling layer 330. Note that each or either of the magnetic pSAF layers 325 and 335 in the pSAF 320 can be substituted with Co/Pt layers or combination of both Co/Ni with Co/Pt multilayers.

Fabrication of pSAF 320 further can include step 216, in which the reference layer 340 of perpendicular magnetic tunnel junction 355 is fabricated. In an embodiment, the step 216 of fabricating reference layer 340 comprises step 218, in which a ferromagnetic coupling layer 345 is deposited, and step 220, in which a fixed magnetic direction layer 350 is deposited. In an embodiment, ferromagnetic coupling layer 345 can comprise a Co/Ta multilayer, while fixed magnetic direction layer 350 can be comprised of a layer of CoFeB film and Ta, the combination of which has perpendicular anisotropy.

The Co layer of Co/Ta ferromagnetic coupling layer 345 can have a thickness of 0.21 nm and the Ta layer of Co/Ta ferromagnetic coupling layer 345 can have a thickness of 0.25 nm. Fixed magnetic direction layer 350 can comprise layers of CoFeB with a Ta interlayer. In an embodiment, fixed magnetic direction layer 350 comprises a 0.7 nm thick layer of CoFeB, a 0.25 nm layer of Ta and a 0.8 nm thick layer of CoFeB. Note that Ta interlayer can be substituted by other materials such as tungsten (W), hafnium (Hf), etc. Ferromagnetic coupling layer 345 of the reference layer 340 couples fixed magnetic direction layer 350 to second magnetic pSAF layer 335 of the perpendicular synthetic antiferromagnet structure 320, which assists in maintaining the perpendicular magnetic direction of reference layer 340, free layer 365 (to be discussed) and thermal stability enhancement layer 380 (also to be discussed).

At step 222, the remaining layers of perpendicular magnetic tunnel junction 355 are fabricated. As discussed, perpendicular magnetic tunnel junction 355 comprises a reference layer 340 and free layer 365 separated by a non-magnetic tunneling barrier layer 360. In an embodiment, non-magnetic tunneling barrier layer 360 is deposited at step 224. Non-magnetic tunneling barrier layer 360 is comprised of an insulator material, which can be an approximately one (1) nm thick layer of magnesium oxide (MgO). After depositing non-magnetic tunneling barrier layer 360, step 226 is performed, which deposits free layer 365. In these embodiments, free layer 365 can comprise CoFeB layers and Ta interlayer. In an embodiment, a first CoFeB layer has thicknesses of 1.1 nm CoFeB, the Ta layer has a thickness of 0.25 nm and the second CoFeB layer has a thickness of 0.5 nm CoFeB. Note that other materials can replace the Ta interlayer, examples of which are tungsten (W), hafnium (Hf), etc.

Both free layer 365 and reference layer 340 have perpendicular anisotropy and thus have a magnetic direction that is perpendicular to the plane of each respective layer. Depending on the logic level stored in the device, magnetic directions of the reference layer and the free layer will either be parallel or antiparallel.

At step 230, non-magnetic thermal stability enhancement coupling layer 375, the purpose of which will be discussed below, is fabricated over free layer 365 of perpendicular magnetic tunnel junction. Then, at step 232, thermal stability enhancement layer 380 is fabricated over non-magnetic thermal stability enhancement coupling layer 375. In an embodiment, thermal stability enhancement layer 380 comprises a CoFeB ferromagnetic layer having perpendicular anisotropy with a thickness between 0.35 nm and 1.5 nm, while non-magnetic thermal stability enhancement coupling layer 375 can comprise a layer of MgO, and can have a thickness that can vary from 0.6-1.2 nm. The choice of MgO thickness is selected so that different magnetic coupling strengths to free layer 365 can be achieved. For MgO thickness of about 0.6 nm to 0.75 nm, magnetic coupling of the thermal stability enhancement layer 380 to the free layer is strong, and allows optimization of the free layer stability. In one embodiment, non-magnetic thermal stability enhancement coupling layer 375 is comprised of a 0.7 nm layer of MgO. As the thickness of the MgO of the non-magnetic thermal stability enhancement coupling layer 375 increases, magnetic coupling will exponentially decrease. The thermal stability enhancement layer 380 will become less and less coupled to the free layer 365 when the thickness of the MgO of the non-magnetic thermal stability enhancement coupling layer 375 increases and finally decouples when MgO thickness exceeds approximately 1.2 nm. A non-magnetic metal or metallic layer can be substituted for the MgO used in this embodiment for the non-magnetic thermal stability enhancement coupling layer 375.

In an embodiment of the device 300 shown in FIG. 3, thermal stability enhancement layer 380 comprises a layer of CoFeB having a thickness of 0.35 nm deposited over non-magnetic thermal stability coupling layer 375. In another embodiment, thermal stability enhancement layer 380 comprises a layer of CoFeB having a thickness between 1.3 nm and 1.5 nm. As shown in FIG. 3, thermal stability enhancement layer 380 is magnetic, has perpendicular anisotropy, and has a magnetic direction (illustrated by the arrow) perpendicular to its plane. As will also be discussed, the magnetic direction of thermal stability enhancement layer 380 can switch, and will generally track the magnetic direction of free layer 365.

As discussed, non-magnetic thermal stability coupling layer 375 can comprise an MgO layer having a thickness of 0.7 nm. The thin CoFeB thermal stability enhancement layer 380 and MgO non-magnetic thermal stability enhancement coupling layer 375 enable improved recrystallization of the MgO of non-magnetic tunneling barrier layer 360 and the CoFeB of free layer 365 of perpendicular magnetic tunnel junction 355 during the annealing process used to manufacture device 300. Enhanced recrystallization of MgO of non-magnetic tunneling barrier layer 360 and the CoFeB of free layer 365 improves the performance (including thermal stability) of the perpendicular MTJ structure 355. Note that in alternative embodiments, thermal stability enhancement layer 380 can be construed with materials other than CoFeB, such as alloys of Co, Fe, Ni, or B.

A final step 234 in the process 200 is fabrication of a capping structure over the thermal stability enhancement layer 380. Cap 385 can comprise a 2 nm TaN layer and a layer of Ru having a thickness of 10 nm.

Non-magnetic thermal stability enhancement coupling layer 375 (e.g., an MgO layer) ferromagnetically couples thermal stability enhancement layer 380 to free layer 365 and can be used to control degree of stabilization of free layer 365, thus also allowing indirect tuning of switching current needed for switching the magnetic direction of free layer 365. The thickness of thermal stability enhancement layer 380 can be adjusted (from 0.1 to 3 nm) to optimize thermal stability and switching currents for different device sizes, and the choice of such thickness will be influenced by many factors, including the thickness of the MTJ layers.

Figure 4:
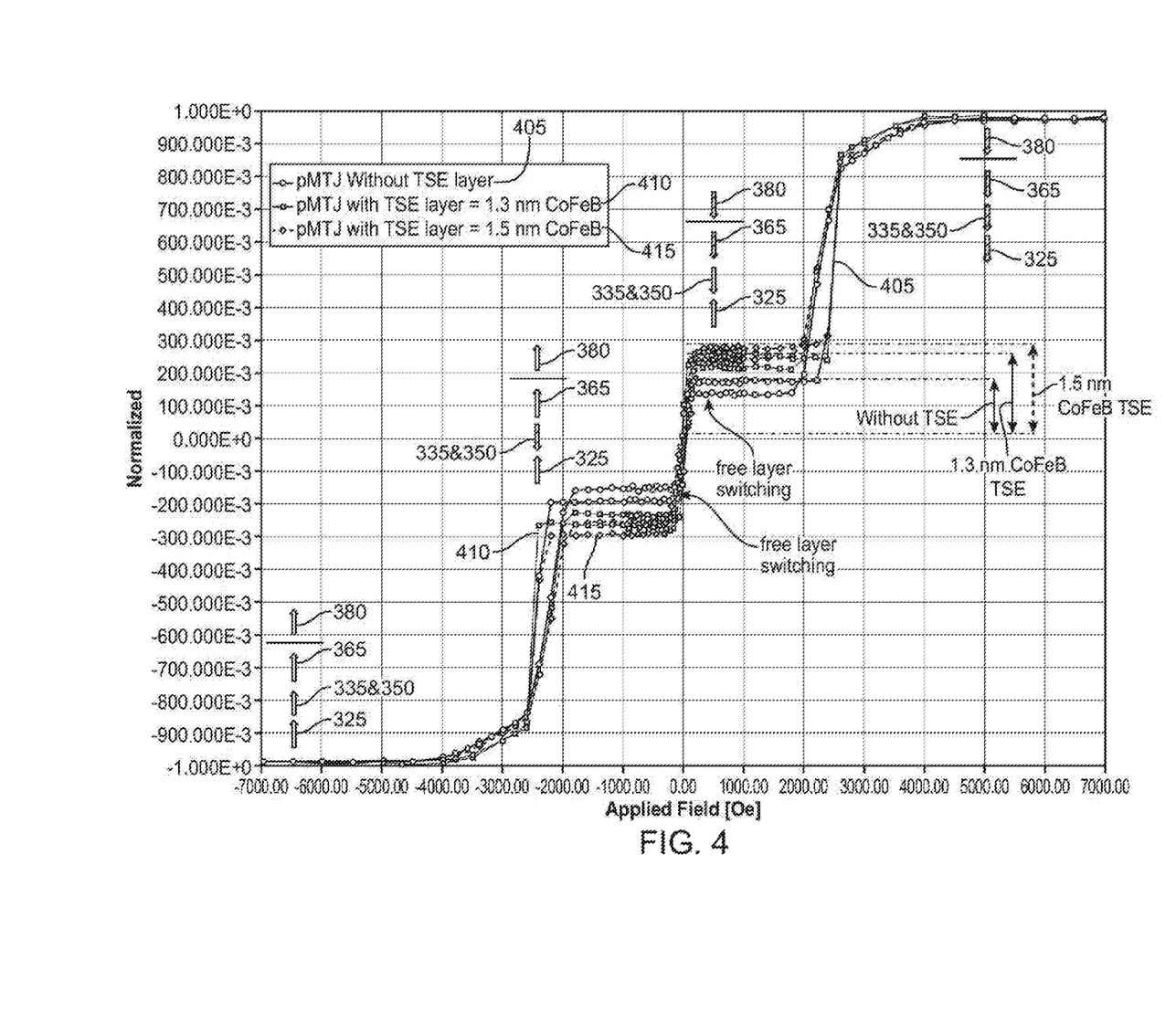
FIG. 4 is a graph of the thin film vibrating sample magnetometer (VSM) major hysteresis loop data for various perpendicular magnetic tunnel junction devices.

Thermal stability enhancement layer 380 improves the thermal stability of device 300, as will now be discussed with reference to FIGS. 4 and 5. FIG. 4 is a graph of the thin film vibrating sample magnetometer (VSM) major hysteresis loop data for various embodiments of perpendicular magnetic tunnel junction device. Note that for these tests, the devices sizes for each were the largely the same except for the thickness of the thermal stability enhancement layer 380. The embodiments included a device having a perpendicular magnetic tunnel junction 355, but with no thermal stability enhancement layer 380. The VSM major hysteresis loop for this embodiment is labeled as curve 405. A second embodiment is a device having a perpendicular magnetic tunnel junction 355 and a thermal stability enhancement layer 380 comprising a 1.3 nanometer layer of CoFeB. The VSM major hysteresis loop for this embodiment is labeled as curve 410. A third embodiment is a device having a perpendicular magnetic tunnel junction 355 and a thermal stability enhancement layer 380 comprising a 1.5 nanometer layer of CoFeB. The VSM major hysteresis loop for this embodiment is labeled as curve 415.

To obtain this data, a DC field was applied perpendicular to the plane of each. The applied field started at −7000 Oersteds, which then decreased to 0.00 Oersteds, before rising to +7000 Oersteds, another very large magnetic field. The applied field was then decreased steadily from +7000 Oersteds to 0.00 Oersteds, before increasing to −7000 Oersteds. Positive and negative signs of the DC applied field indicate perpendicular applied field directions of the field sweep. VSM measurements, shown as normalized magnetic moment on the Y axis of the graph in FIG. 4, were taken with the DC magnetic field applied along easy magnetic axis i.e. with magnetic field oriented perpendicular to the sample plane. The magnetic direction of the perpendicular anisotropy of Co/Ni layer 325 of perpendicular synthetic antiferromagnetic structure 320, Co/Ni layer 335, CoFeB/Ta layer 350 (of reference layer 340), free layer 365 and thermal stability enhancement layer 380 are shown for various magnetic field strengths by the arrows in FIG. 4.

As can be seen in FIG. 4, when the applied magnetic field is at approximately −6500 Oersteds, the magnetic direction of first magnetic pSAF layer 325 of perpendicular synthetic antiferromagnetic structure 320, second magnetic pSAF layer 335, fixed magnetic direction layer 350 (of reference layer 340), free layer 365 and thermal stability enhancement layer 380 are all parallel to one another. As the magnetic field decreases to approximately −2500 Oersteds, which is a much larger magnetic field than an MRAM device would experience in real world application, the magnetic direction of second magnetic pSAF layer 335 and fixed magnetic direction layer 350 of reference layer 340 switches such that it is antiparallel to free layer 365. However, with a large magnetic field applied, free layer 365 has not switched.

When the applied magnetic field at approximately 0.00 Oersteds moves from negative to positive, FIG. 4 shows that the magnetic direction of free layer 365 and thermal stability enhancement layer 380 switch. The magnetic direction of second magnetic pSAF layer 335 and fixed magnetic direction layer layer 350 of reference layer 340, however, does not switch. This demonstrates that for each embodiment (e.g., devices with and without a thermal stability enhancement layer 380), the reference layer 340 does not switch. Thus, FIG. 4 shows that presence of thermal stability enhancement layer 380 does not negatively affect the performance of reference layer 340 (i.e., reference layer 340 is still difficult to switch).

As the applied magnetic field starts increasing, for example, at +5000 Oersteds, FIG. 4 shows that magnetic direction of second magnetic pSAF layer 335 and fixed magnetic direction layer 350 of reference layer 340 (and first magnetic pSAF layer 325 of perpendicular synthetic antiferromagnetic structure 320) switch such that the magnetic direction of each of these layers are parallel again. To complete the VSM major hysteresis loops for each of these embodiments, the applied magnetic field is then reduced to 0.00 Oersteds, where it is then increased, as each of the curves 405, 410 and 415 in FIG. 4 show. As is seen, the switching characteristics of each of the first magnetic pSAF layer 325 of perpendicular synthetic antiferromagnetic structure 320, second magnetic pSAF layer 335, fixed magnetic direction layer layer 350 (of reference layer 340), free layer 365 and thermal stability enhancement layer 380 are similar for this portion of the VSM hysteresis loop.

In FIG. 4, curves 405, 410 and 415 show that the magnetic direction of free layer 365 for each embodiment in this example switches at approximately 0.00 Oersteds. As also seen in FIG. 4, the magnetic moment (the Y axis) for each embodiment is increased for the embodiments having thermal stability enhancement layer 380 (see curves 410 and 415) compared to the free layer of a perpendicular MTJ device without a thermal stability enhancement layer 380 (see curve 405). Thus, both embodiments constructed with a thermal stability enhancement layer 380 over the free layer demonstrated an increase in magnetic volume of the individual perpendicular MTJ.

Non-magnetic thermal stability enhancement coupling layer 375 between thermal stability enhancement layer 380 and free layer 365 provides high interface perpendicular magnetic anisotropy (IPMA), which acts to maintain the magnetic direction of both free layer 365 and thermal stability enhancement layer 380 out-of-plane, thus ensuring that the magnetization direction of the thermal stability enhancement layer 380 and free layer 365 are perpendicular to their planes.

Figure 5:
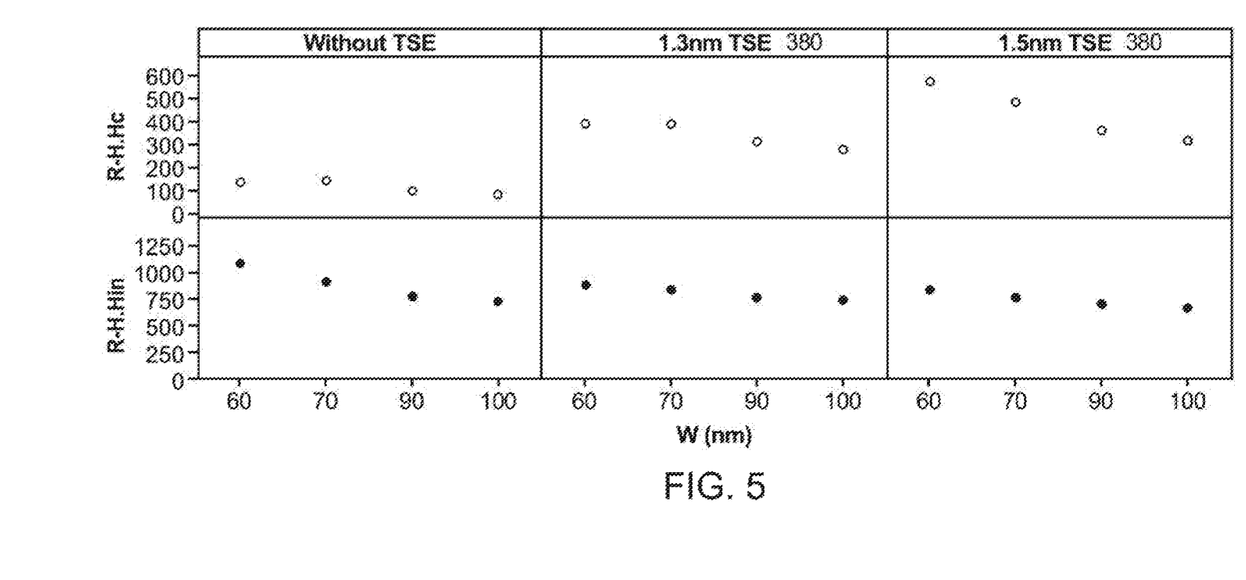
FIG. 5 is a graph comparing the thermal stability of devices that have a thermal stability enhancement layer against devices without a thermal stability enhancement layer.

FIG. 5 compares performance data for devices 300 having a thermal stability enhancement layer 380 against devices without a thermal stability enhancement layer 380. The first row contains median values of coercive fields Hc (in Oersteds) versus device diameter (in nanometers). The second row shows loop shift from zero (0) Oersteds for the magnetic field acting on free layer 365, which is indicative of the magnetostatic coupling between free layer 365 and perpendicular synthetic antiferromagnet (pSAF) structure having reference layer 340. As with the tests illustrated in FIG. 4, device sizing for each example shown in FIG. 5 were the same except for the presence and thickness of thermal stability enhancement layer 380.

In particular, FIG. 5 compares coercive fields (Hc) for a device having no thermal stability enhancement layer 380 (column 1), a device having a thermal stability enhancement layer 380 with a thickness of 1.3 nanometers (column 2), and a device having a thermal stability enhancement layer 380 with a thickness of 1.5 nanometers (column 3). As is known, coercive field (Hc) is a good indicator for thermal stability (which is difficult to measure directly). Devices 300 having widths of 60 nm, 70 nm, 90 nm and 100 nm were fabricated and tested for each embodiment. As is easily seen, devices 300 having a 1.3 nanometer thick thermal stability enhancement layer 380 have significantly improved thermal stability when compared to devices without such a layer. Likewise, devices 300 having a 1.5 nm thick thermal stability enhancement layer 380 further improve thermal stability. Indeed, as seen in FIG. 5, coercive fields (Hc) for devices with thermal stability enhancement layers 380 increase from approximately 100 Oersteds to approximately 400 Oersteds. This demonstrates that the thermal stability of perpendicular magnetic tunnel junctions is improved when thermal stability enhancement layer 380 is present.

At the same time as coercivity Hc increases, critical switching currents are not increased in a manner that might cause performance issues, which is contrary to what a person having ordinary skill in the art would expect from such a large volume of magnetization. This can be seen in Table 1. In particular, Table 1 shows the critical switching parameters for the same test devices used to collect the data in FIG. 5:

| Parameter | No TSE Layer | 1.3 nm TSE Layer 380 | 1.5 nm TSE Layer 380 |
| --- | --- | --- | --- |
| Jc0+/− | 2.1/2.1 | 4.3/5.6 | 5.2/6.5 |
| Vc0+/− | 0.36/0.54 | 0.61/0.94 | 0.7/0.91 |
| Delta+/− | 20/22 | 34/32 | 30/40 |
| TMR % | 100 | 97 | 97 |
| Ra $\Omega\mu m^2$ | 12.3 | 13 | 13 |

In Table 1, Jc0 is the critical switching current density. Vc0 is critical switching voltage. Delta is the thermal stability factor. TMR is the tunneling magnetoresistance. RA is the resistance area product of the tunnel junction. Note also that "+/−" indicates the positive/negative direction of the perpendicular voltage applied to the test devices. As the data in Table 1 demonstrates, an MRAM memory cell having a perpendicular MTJ and a thermal stability enhancement layer 380, where the thickness of thermal stability enhancement layer 380 and free layer 365 have a combined thickness of 3 nm, achieves both out of plane magnetization and low critical switching currents.

Note that the embodiment discussed in the context of FIG. 3 has a thermal stability enhancement layer 380 constructed of CoFeB, the thermal stability enhancement layer 380 can also be constructed using a variety of other ferromagnetic materials, examples of which are Co, Ni, Fe, and their alloys. In particular CoFeB (Ms~1200 emu/cc) or CoFe (Ms~1500 emu/cc) can be used. By use of or proper alloying of these materials, one can achieve desired magnetization values for the thermal stability enhancement layer 380, and thus be able to control ferromagnetic coupling strength and degree of the thermal stability of the free layer.

MRAM devices 300 having perpendicular magnetic tunnel junctions and thermal stability enhancement layers 380 as described herein can be fabricated using thin film deposition. Layer stacks are deposited by means of conventional DC and RF sputtering methods using commercially available Physical Vapor Deposition (PVD) tools. Layer stacks can be annealed after deposition at 300° C., 1 hour soak time without magnetic field.

In sum, one aspect of the present teachings is forming a magnetic layer that is magnetically coupled to the free layer of a perpendicular magnetic tunnel junction. This magnetic layer, described herein as the TSE layer, has a magnetization direction perpendicular to its plane, and separated from the free layer of an MTJ with a non-magnetic separation layer.

A person of skill will understand that the above disclosure maps only particular embodiments. It should be further understood that intervening layers can occur even when one layer is described as having been placed over, is covering, or is on top of another layer. That understanding applies to the claims. It should further be understood that while the MTJ pillars have been depicted in two-dimensional cross sections, they are three dimensional objects and the layers discussed may cover the three dimensional top, all sides, and all surrounding valley portions of the MTJ pillars.

It should also be appreciated to one skilled in the art that a plurality of devices 300 can be manufactured and provided as respective bit cells of an STT-MRAM device. In other words, each device 300 can be implemented as a bit cell for a memory array having a plurality of bit cells.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A method of forming a magnetic device, comprising fabricating a bottom electrode in a first plane;
   fabricating a perpendicular synthetic antiferromagnetic structure, wherein the perpendicular synthetic antiferromagnetic structure includes a magnetic reference layer in a second plane, the magnetic reference layer having a magnetization direction that is perpendicular to the second plane and having a fixed magnetization direction;
   fabricating a non-magnetic tunnel barrier layer in a third plane such that the nonmagnetic tunnel barrier is disposed over the magnetic reference layer;
   fabricating a free magnetic layer in a fourth plane such that the free magnetic layer is disposed over the non-magnetic tunnel barrier layer, the free magnetic layer having a magnetization vector that is perpendicular to the fourth plane and having a magnetization direction that can switch from a first magnetization direction to a second magnetization direction, the magnetic reference layer, the non-magnetic tunnel barrier layer and the free magnetic layer forming a magnetic tunnel junction;
   fabricating a non-magnetic thermal stability enhancement coupling layer in a fifth plane such that the non-magnetic thermal stability enhancement coupling layer is disposed over the free magnetic layer, the non-magnetic thermal stability enhancement coupling layer being comprised of an insulator material;
   fabricating a magnetic thermal stability enhancement layer in a sixth plane such that the magnetic thermal stability enhancement layer is physically separated from the free magnetic layer of the magnetic tunnel junction and coupled to the free magnetic layer by the non-magnetic thermal stability enhancement coupling layer, the magnetic thermal stability enhancement layer having a magnetization direction that is perpendicular to the sixth plane and having a magnetization direction that can switch from the first magnetization direction to the second magnetization direction, wherein switching of the magnetic thermal stability enhancement layer from the first magnetization direction to the second magnetization direction tracks switching in the magnetic free layer; and
   fabricating a cap layer in a seventh plane such that the cap layer is disposed over the thermal stability enhancement layer;
   wherein the step of fabricating the perpendicular synthetic antiferromagnetic structure comprises:
   fabricating a first magnetic pSAF layer;
   fabricating an exchange coupling layer over the first magnetic pSAF layer; and
   fabricating a second magnetic pSAF layer, wherein the first magnetic pSAF layer is over the first electrode and is separated from the second magnetic pSAF layer by the exchange coupling layer;
   fabricating a ferromagnetic coupling layer in between the second magnetic pSAF layer and the magnetic reference layer.

2. The method of claim 1 wherein the magnetic thermal stability enhancement layer comprises a layer of CoFeB.

3. The method of claim 1 wherein the magnetic thermal stability enhancement layer comprises a film of CoFeB having a thickness between 1.3 nanometers and 1.5 nanometers.

4. The method of claim 3 wherein the free magnetic layer comprises CoFeB with a Ta interlayer.

5. The method of claim 4 wherein the free magnetic layer has a sum thickness of 1.6 nanometers.

6. The method of claim 1 wherein the non-magnetic thermal stability enhancement coupling layer comprises a layer MgO.

7. The method of claim 6, wherein the layer of MgO has a thickness between 0.6-1.2 nm.

8. The method of claim 7, wherein the layer of MgO has a thickness 0.7 nm.

9. A method of manufacturing a magnetic device, comprising:
   fabricating a perpendicular magnetic tunnel junction having a magnetic reference layer, a non-magnetic tunneling barrier layer and a magnetic free layer, the magnetic reference layer and the magnetic free layer separated by the non-magnetic tunneling barrier layer, the magnetic reference layer having a fixed magnetic direction that is perpendicular to its plane, the magnetic free layer having a variable magnetic direction that can switch between a first perpendicular magnetic direction and second perpendicular magnetic direction, wherein the first perpendicular magnetic direction and the second perpendicular magnetic direction is perpendicular to the magnetic free layer;
   fabricating a non-magnetic thermal stability enhancement coupling layer over the magnetic free layer of the magnetic tunnel junction; and
   fabricating a magnetic thermal stability enhancement layer over the magnetic thermal stability enhancement coupling layer, the magnetic thermal stability enhancement layer comprising a magnetic material having a variable magnetic direction that can switch between the first perpendicular magnetic direction and the second perpendicular magnetic direction, wherein switching of the magnetic thermal stability enhancement layer from the first magnetization direction to the second magnetization direction tracks switching in the magnetic free layer, wherein the non-magnetic thermal stability enhancement coupling layer is in between and physically separates the magnetic free layer of the magnetic tunnel junction and the magnetic thermal stability enhancement layer, the non-magnetic thermal stability enhancement coupling layer magnetically coupling the free magnetic layer and the magnetic thermal stability coupling layer, the non-magnetic thermal stability enhancement coupling layer being comprised of an insulator material;

wherein the magnetic thermal stability enhancement layer comprises a film of CoFeB having a thickness between 1.3 nanometers and 1.5 nanometers; and wherein the free magnetic layer comprises CoFeB layers with a Ta interlayer.

10. The method of claim 9, further comprising:

fabricating an electrode onto a substrate;

fabricating a perpendicular synthetic antiferromagnetic structure over the electrode, the perpendicular synthetic antiferromagnetic structure including the magnetic reference layer; and fabricating a cap layer disposed over the magnetic thermal stability enhancement layer.

11. The method of claim 10, wherein the fabricating the perpendicular synthetic antiferromagnetic structure step comprises;

fabricating a first magnetic pSAF layer;

fabricating a non-magnetic exchange coupling layer over the first magnetic pSAF layer; and fabricating a second magnetic pSAF layer, where the first magnetic pSAF layer is separated from the second magnetic pSAF layer by the non-magnetic exchange coupling layer.

12. The method of claim 9 wherein the magnetic thermal stability enhancement layer comprises CoFeB.

13. The method of claim 1 wherein the free magnetic layer has a sum thickness of 1.6 nanometers.

* * * * *